US012795907B2

(12) United States Patent
Lin et al.

(10) Patent No.: US 12,795,907 B2
(45) Date of Patent: Nov. 10, 2026

(54) THREE-DIMENSIONAL MEMORY WITH SUPER-PILLAR

(71) Applicant: Intel NDTM US LLC, Santa Clara, CA (US)

(72) Inventors: Chih Ting Lin, Liaoning (CN); Nan Wu, Liaoning (CN); Xiangqin Zou, Liaoning (CN); Ngoc Quynh Hoa Le, Liaoning (CN)

(73) Assignee: Intel NDTM US LLC, Santa Clara, CA (US)

( * ) Notice: Subject to any disclaimer, the term of this patent is extended or adjusted under 35 U.S.C. 154(b) by 288 days.

(21) Appl. No.: 17/702,001

(22) Filed: Mar. 23, 2022

(65) Prior Publication Data

US 2023/0276621 A1 Aug. 31, 2023

Related U.S. Application Data

(63) Continuation of application No. PCT/CN2022/078315, filed on Feb. 28, 2022.

(51) Int. Cl.
*H10B 41/27* (2023.01)

(52) U.S. Cl.
CPC .................................... *H10B 41/27* (2023.02)

(58) Field of Classification Search
None
See application file for complete search history.

(56) References Cited

U.S. PATENT DOCUMENTS

| | | | | |
|---|---|---|---|---|
| 10,504,596 | B2 * | 12/2019 | Goda | H10B 41/27 |
| 10,622,374 | B2 * | 4/2020 | Zhu | H01L 21/31111 |
| 10,685,723 | B1 * | 6/2020 | Chen | G11C 16/0483 |
| 2018/0331118 | A1 * | 11/2018 | Amano | H01L 21/76856 |
| 2020/0135751 | A1 * | 4/2020 | Liu | H01L 21/32 |

* cited by examiner

*Primary Examiner* — Sarah K Salerno
(74) *Attorney, Agent, or Firm* — Morgan, Lewis & Bockius LLP

(57) ABSTRACT

An embodiment of a memory device may comprise a super-pillar formed through a plurality of sub-decks, a string of memory cells formed along the super-pillar, and respective regions of transition material disposed between respective sub-decks of the plurality of sub-decks, wherein the super-pillar comprises at least a first pillar formed through a first sub-deck of the plurality of sub-decks substantially aligned with a second pillar formed through a second sub-deck of the plurality of sub-decks. Other embodiments are disclosed and claimed.

20 Claims, 11 Drawing Sheets

THREE-DIMENSIONAL MEMORY WITH SUPER-PILLAR

CLAIM FOR PRIORITY

This application claims priority to International Patent Application No. PCT/CN2022/078315, filed Feb. 28, 2022 and titled "THREE-DIMENSIONAL MEMORY WITH SUPER-PILLAR," which is incorporated by references in its entirety for all purposes.

BACKGROUND

A typical flash memory device may include a memory array that includes a large number of non-volatile memory cells arranged in row and column fashion. In recent years, vertical memory, such as three-dimensional (3D) memory, has been developed in various forms, such as NAND, cross-point, or the like. A 3D flash memory array may include a plurality of memory cells stacked over one another to form a vertical NAND string. With an increased number of tiers in 3D NAND, and increased block size, the minimum data unit that can be erased at once also increases. To reduce the block size, some 3D NAND memory devices may utilize a block-by-deck (BBD) architecture. In an example BBD architecture, the tiers are divided into 3 decks, with 48 write-lines (WLs) in each deck, and the block size is reduced from 144 MB to 48 MB. Decks can be assigned to any combination of quad-level cell (QLC) or single-level cell (SLC) blocks. In a floating gate flash cell, a conductive floating gate may be positioned between a control gate and a channel of a transistor. The individual memory cells of the vertical NAND string may be on different layers arranged around a body that extends outward from a substrate, with the conductive floating gate (charge storage region) located on a similar or same plane as the control gate, extending outward horizontally from the body.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
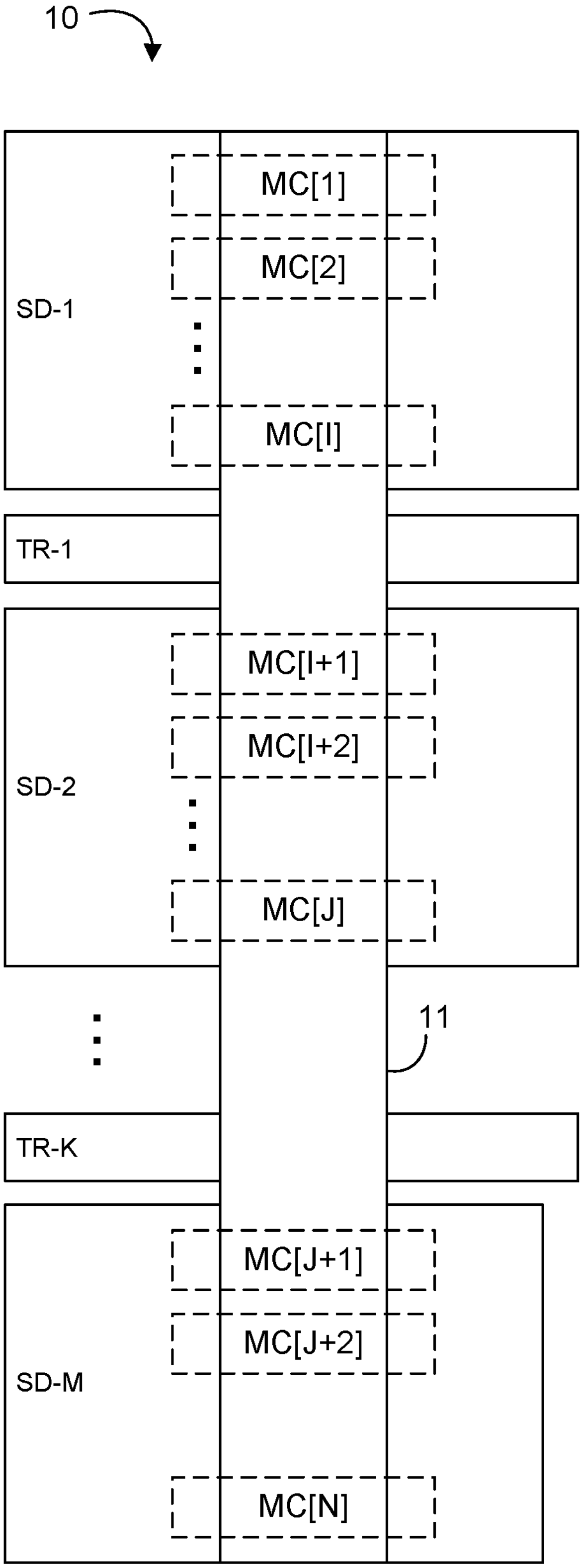
FIG. 1A is a block diagram of an example of a memory device according to an embodiment.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

The material disclosed herein may be implemented in hardware, Field Programmable Gate Array (FPGA), firmware, driver, software, or any combination thereof. The material disclosed herein may also be implemented as instructions stored on a machine-readable medium, which may be read and executed by Moore Machine, Mealy Machine, and/or one or more processors. A machine-readable medium may include any medium and/or mechanism for storing or transmitting information in a form readable by a machine (e.g., a computing device). For example, a machine-readable medium may include read only memory (ROM); random access memory (RAM); Dynamic random-access memory (DRAM), magnetic disk storage media; optical storage media; NV memory devices; phase-change memory, qubit solid-state quantum memory, electrical, optical, acoustical or other forms of propagated signals (e.g., carrier waves, infrared signals, digital signals, etc.), and others.

References in the specification to "one implementation", "an implementation", "an example implementation", etc., indicate that the implementation described may include a particular feature, structure, or characteristic, but every embodiment may not necessarily include the particular feature, structure, or characteristic. Moreover, such phrases are not necessarily referring to the same implementation. Further, when a particular feature, structure, or characteristic is described in connection with an embodiment, it is submitted that it is within the knowledge of one skilled in the art to effect such feature, structure, or characteristic in connection with other implementations whether or not explicitly described herein.

NV memory (NVM) may be a storage medium that does not require power to maintain the state of data stored by the medium. In one embodiment, the memory device may include a three-dimensional (3D) NAND or similar device. The memory device may refer to the die itself and/or to a packaged memory product. In particular embodiments, a memory component with non-volatile memory may comply with one or more standards promulgated by the JEDEC, or other suitable standard (the JEDEC standards cited herein are available at jedec.org).

Some embodiments may provide super-pillar process integration techniques in 3D NAND memory technology. For 3D NAND floating gate process manufacturing, an important part of the process is the pillar etching. Pillar etching involves the etch of a deep pillar for the flash cell formation. When the pillar gets very deep (e.g., greater than about 5000 nm), the pillar etching may become more challenging because of problems with the pillar bowing, tilting, twisting, and/or distortion caused by a longer process time. Some embodiments may overcome one or more of the foregoing problems.

As used herein, a super-pillar refers to a pillar that comprises two or more substantially aligned sub-pillars. Some embodiments provide technology to reduce or eliminate one or more of the pillar etching problems by separately etching two shorter sub-deck pillars and using a photo alignment process to connect the two sub-deck pillars together as a single super-pillar. In some embodiments, top sub-deck etching is integrated into the whole process flow. In some embodiments, a deck-to-deck transition region process is integrated in the whole process flow. Some embodiments may provide better pillar etching formation by separately etching shorter sub-deck pillars and connecting the sub-deck pillars together. Advantageously, compared with fabrication of a very deep conventional pillar of similar length, embodiments of the super-pillar technology described herein may reduce the pillar etching development cycle and/or significantly reduce manufacturing cost.

Figure 1B:
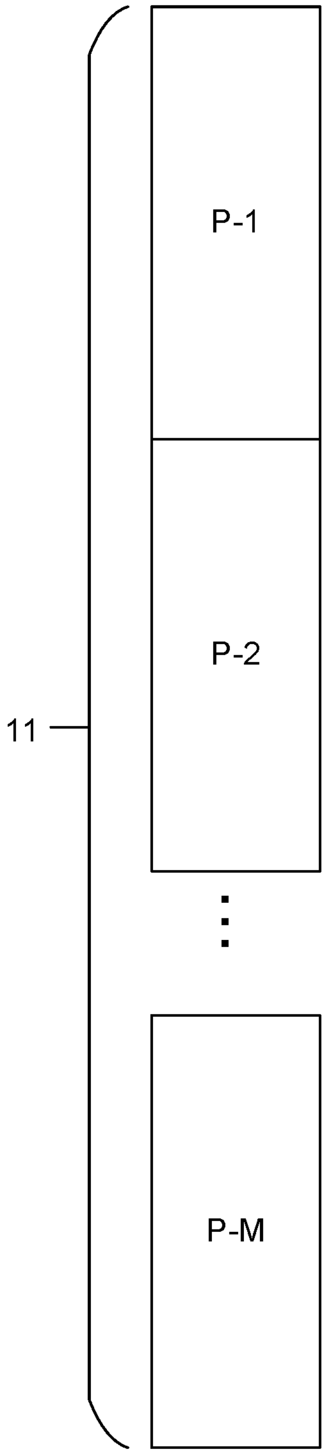
FIG. 1B is a block diagram of an example of a super-pillar according to an embodiment.

With reference to FIGS. 1A to 1B, an embodiment of a memory device 10 may include a super-pillar 11 formed through a plurality of sub-decks (e.g., SD-1 through SD-M; where M>1), a string of memory cells (e.g., MC-1 through MC-N; where N>1) formed along the super-pillar 11, and respective regions of transition material (e.g., TR-1 through TR-K; where K>0, and where K generally is M−1) disposed between respective sub-decks of the plurality of sub-decks, where the super-pillar 11 comprises at least a first pillar P-1 formed through a first sub-deck SD-1 of the plurality of sub-decks substantially aligned with a second pillar P-2 formed through a second sub-deck SD-2 of the plurality of sub-decks (examples of which are described in further detail below). For example, the first sub-deck SD-1 may comprise a first layer stack with alternated layers of conductor material and insulator material, the second sub-deck SD-2 comprises a second layer stack with alternated layers of conductor material and insulator material, and where a first region of transition material TR-1 may be disposed directly between a first outermost layer of insulator material of the first layer stack and a second outermost layer of insulator material of the second layer stack.

In some embodiments, the first region of transition material TR-1, the first layer of insulator material, and the second layer of insulator material may all comprise a same material (e.g., where the transition may be indicated by a seam between the layers). Alternatively, the first region of transition material TR-1 may comprise a different material from one or more of the first layer of insulator material and the second layer of insulator material (e.g., where the transition may be more distinct). Embodiments of the memory device 10 may further include an array of super-pillars formed through the plurality of sub-decks, and respective strings of memory cells formed along respective super-pillars of the array of super-pillars. For example, the memory cells may comprise floating gate NAND memory cells.

Figure 2:
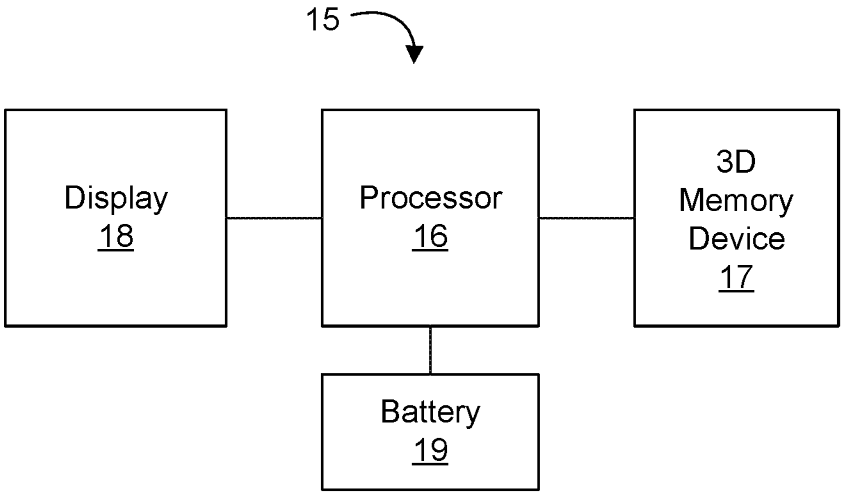
FIG. 2 is a block diagram of an example of a system according to an embodiment.
Figure 3A:
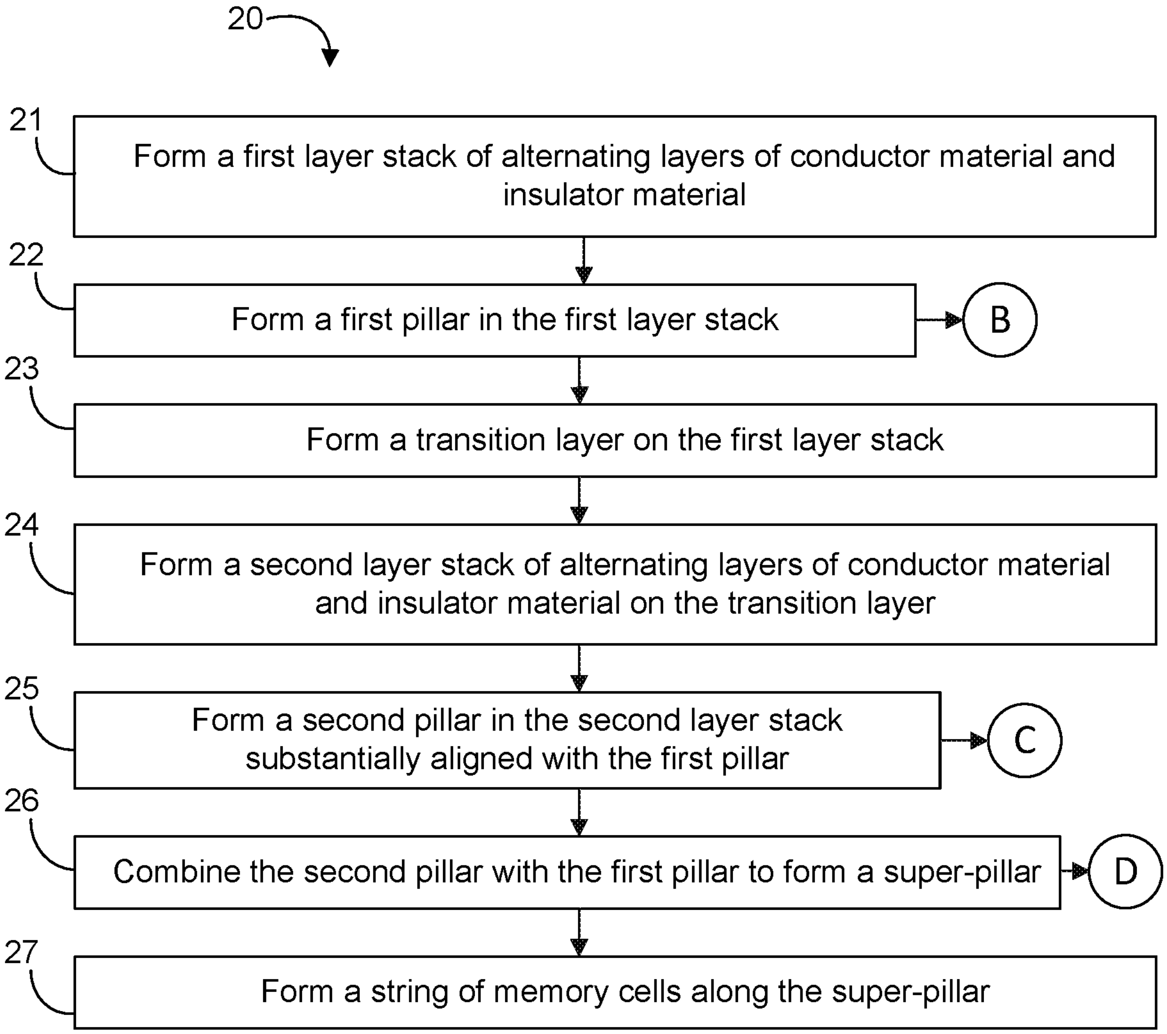
FIGS. 3A to 3D are an illustrative diagram of an example of a method according to an embodiment.
Figure 3B:
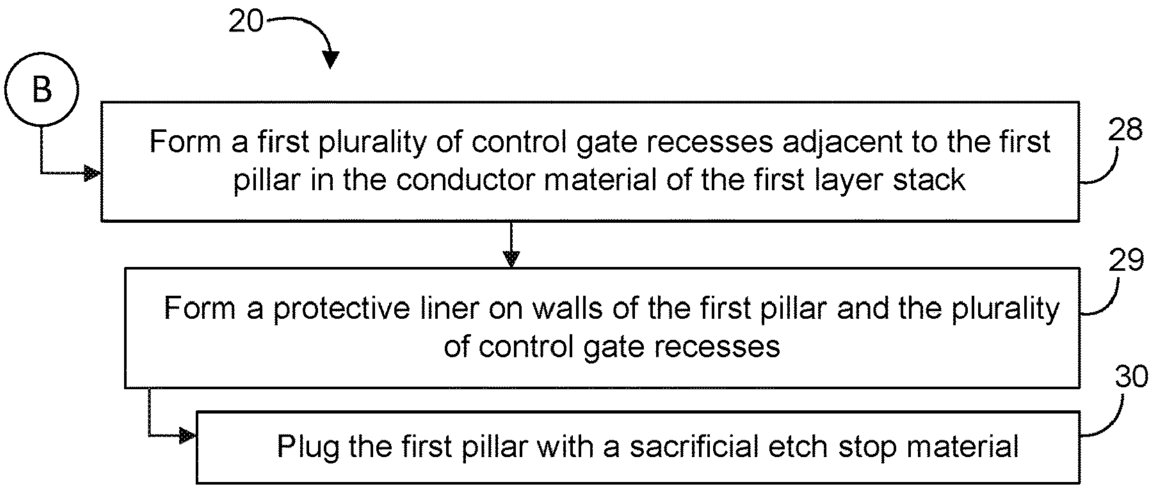
Figure 3C:
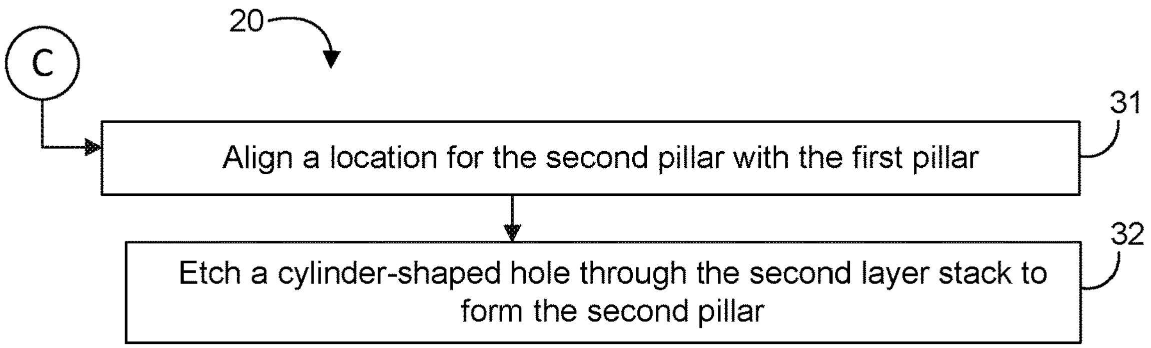
Figure 3D:
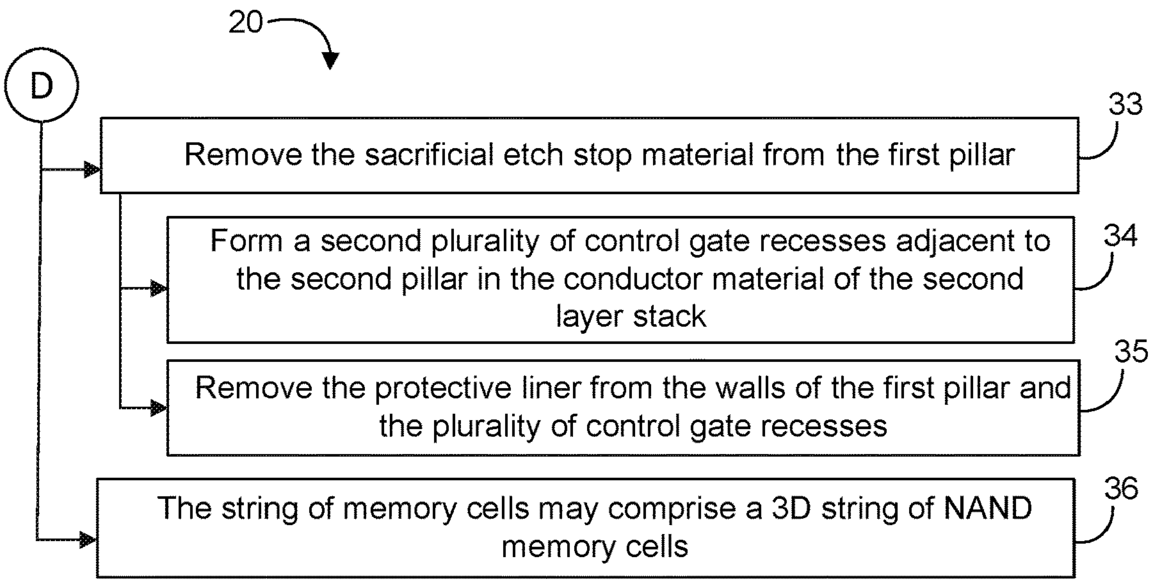

With reference to FIG. 2, an embodiment of a system 15 may include a processor 16, and a 3D memory device 17 coupled with the processor 16, where the 3D memory device 17 is configured similar to the memory device 10. In particular, in the system 15, the 3D memory device 17 may include a super-pillar formed through a plurality of sub-decks, a 3D string of memory cells formed along the super-pillar, and respective regions of transition material disposed between respective sub-decks of the plurality of sub-decks, where the super-pillar comprises at least a first pillar formed through a first sub-deck of the plurality of sub-decks is substantially aligned with a second pillar formed through a second sub-deck of the plurality of sub-decks. For example, the first sub-deck may comprise a first layer stack with alternated layers of conductor material and insulator material, the second sub-deck comprises a second layer stack with alternated layers of conductor material and insulator material, and where a first region of transition material may be disposed directly between a first layer of insulator material of the first layer stack and a second layer of insulator material of the second layer stack.

In some embodiments, the first region of transition material, the first layer of insulator material, and the second layer of insulator material may all comprise a same material. Alternatively, the first region of transition material may comprise a different material from one or more of the first layer of insulator material and the second layer of insulator material. In some embodiments, the 3D memory device 17 may further comprise an array of super-pillars formed through the plurality of sub-decks, and respective 3D strings of memory cells formed along respective super-pillars of the array of super-pillars. For example, the memory cells may comprise floating gate NAND memory cells. In some embodiments, the system 15 may comprise a mobile computing device and may include any of a number of connected devices, peripherals, and/or components, such as at least one of a display 18 communicatively coupled to the processor 16, or a battery 19 coupled to the processor 16, etc.

With reference to FIGS. 3A to 3D, an embodiment of a method 20 may include forming a first layer stack of alternating layers of conductor material (e.g., polysilicon, etc.) and insulator material (e.g., oxide, silicon nitride, etc.) at box 21, forming a first pillar in the first layer stack at box 22, forming a transition layer on the first layer stack at box 23, forming a second layer stack of alternating layers of conductor material and insulator material on the transition layer at box 24, forming a second pillar in the second layer stack substantially aligned with the first pillar at box 25, combining the second pillar with the first pillar to form a super-pillar at box 26, and forming a string of memory cells along the super-pillar at box 27. Some embodiments of the method 20 may further include, prior to forming the transition layer on the first layer stack at box 23, forming a first plurality of control gate recesses adjacent to the first pillar in the conductor material of the first layer stack at box 28, and forming a protective liner on walls of the first pillar and the plurality of control gate recesses at box 29. After forming the protective liner on walls of the first pillar and the first plurality of control gate recesses, the method 20 may further include plugging the first pillar with a sacrificial etch stop material at box 30.

In some embodiments, forming the second pillar in the second layer stack substantially aligned with the first pillar at box 25 may comprises aligning a location for the second pillar with the first pillar at box 31, and etching a cylinder-shaped hole through the second layer stack to form the second pillar at box 32. For example, combining the second pillar with the first pillar to form the super-pillar at box 26 may comprise removing the sacrificial etch stop material from the first pillar at box 33. The method 20 may also include forming a second plurality of control gate recesses adjacent to the second pillar in the conductor material of the second layer stack at box 34, and/or removing the protective liner from the walls of the first pillar and the plurality of control gate recesses at box 35. For example, the string of memory cells may comprise a 3D string of NAND memory cells at box 36.

Figure 4A:
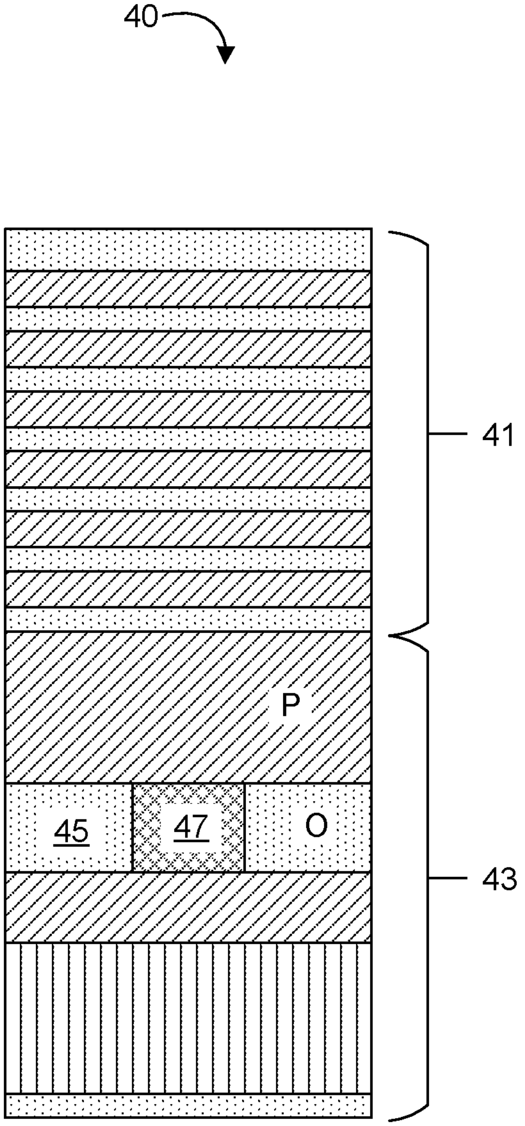
FIGS. 4A to 4N are illustrative diagrams of an example of a super-pillar integration process according to an embodiment.
Figure 4B:
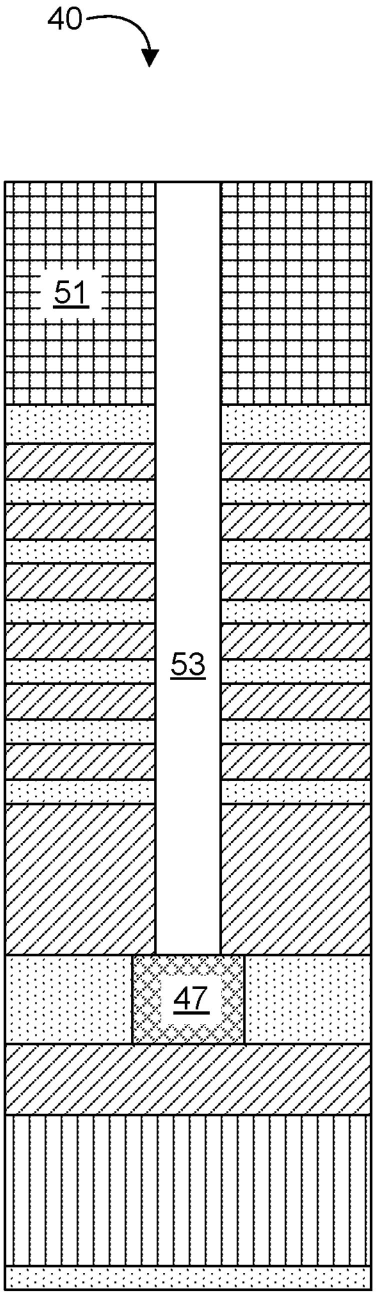
Figure 4C:
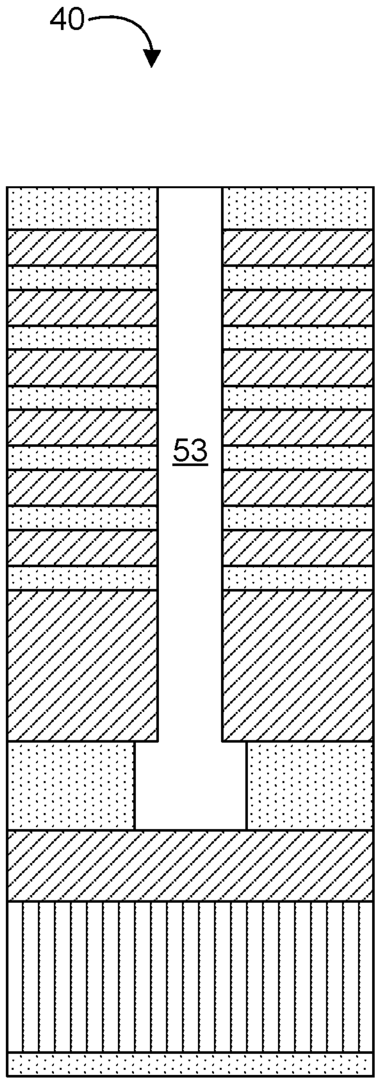
Figure 4D:
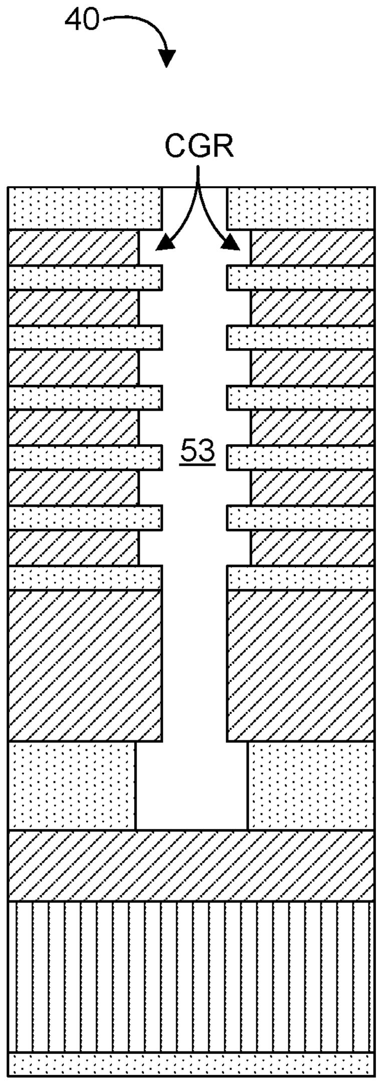
Figure 4E:
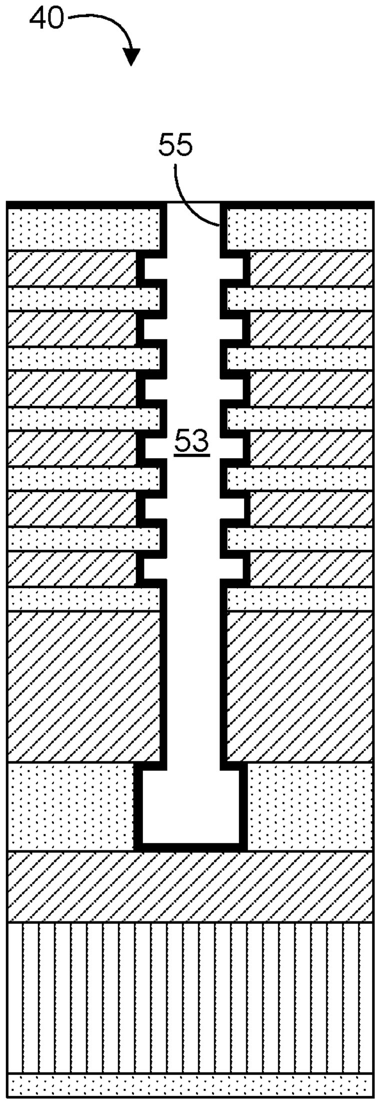
Figure 4F:
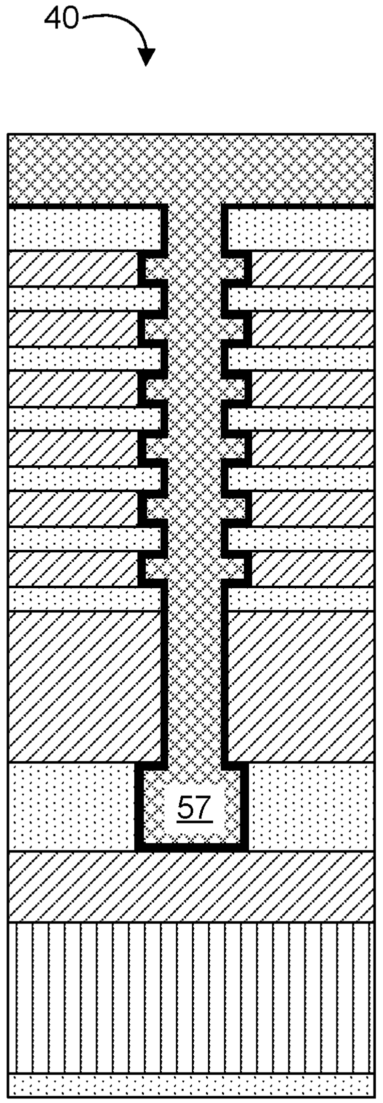
Figure 4G:
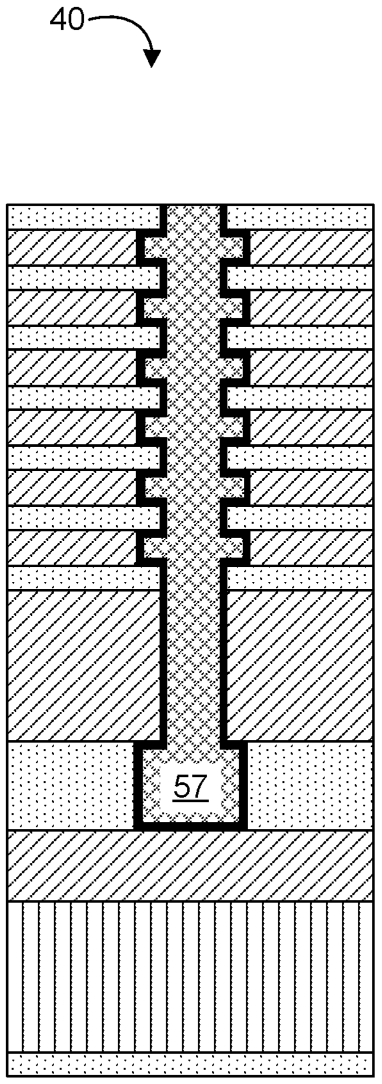
Figure 4H:
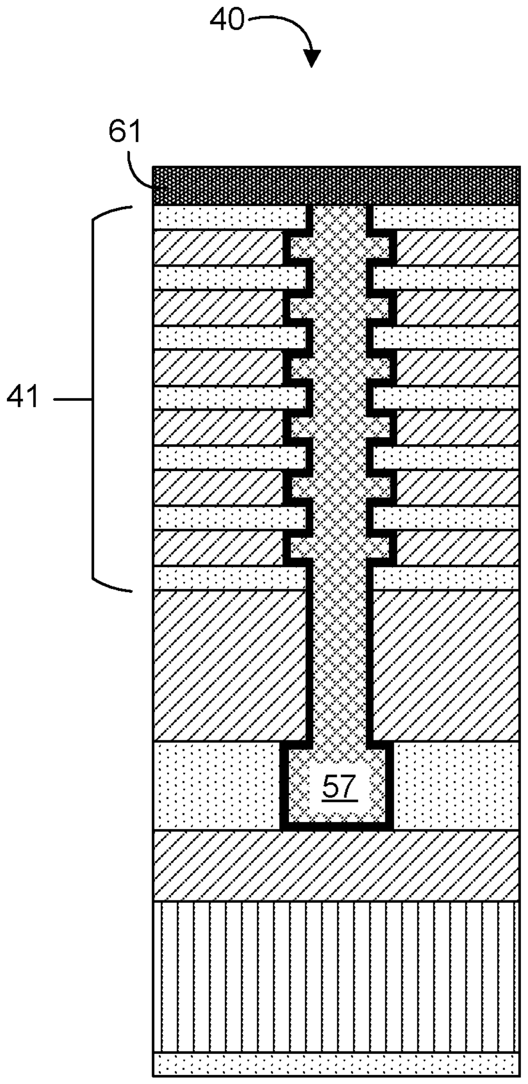
Figure 4I:
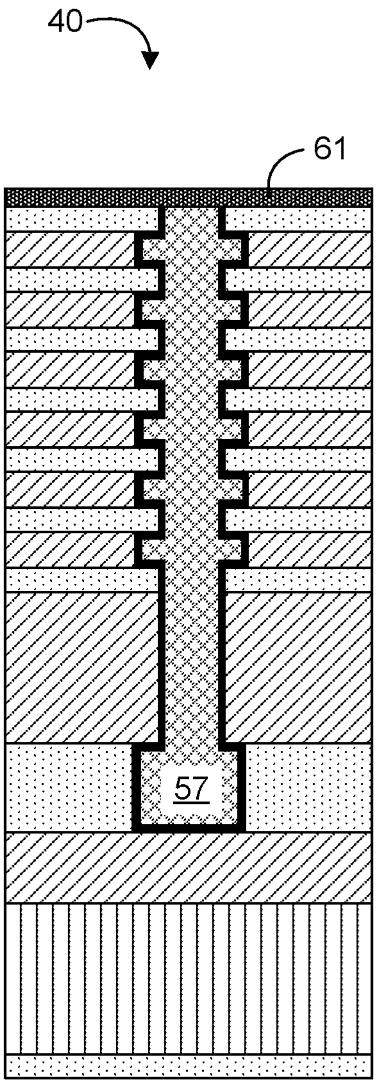
Figure 4J:
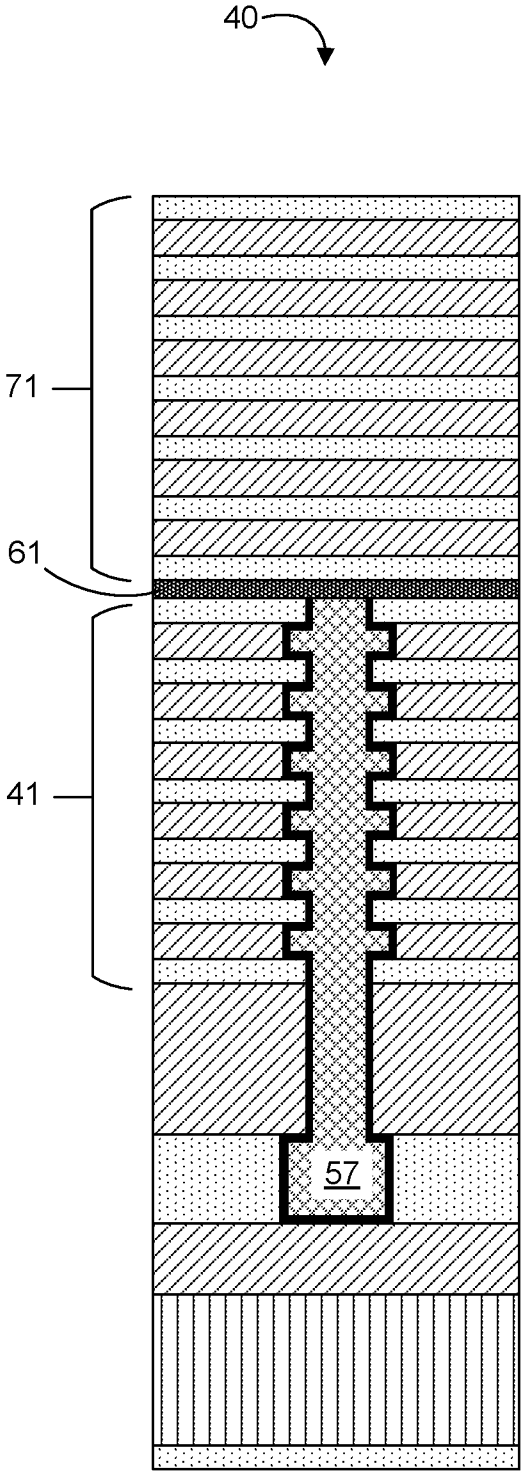
Figure 4K:
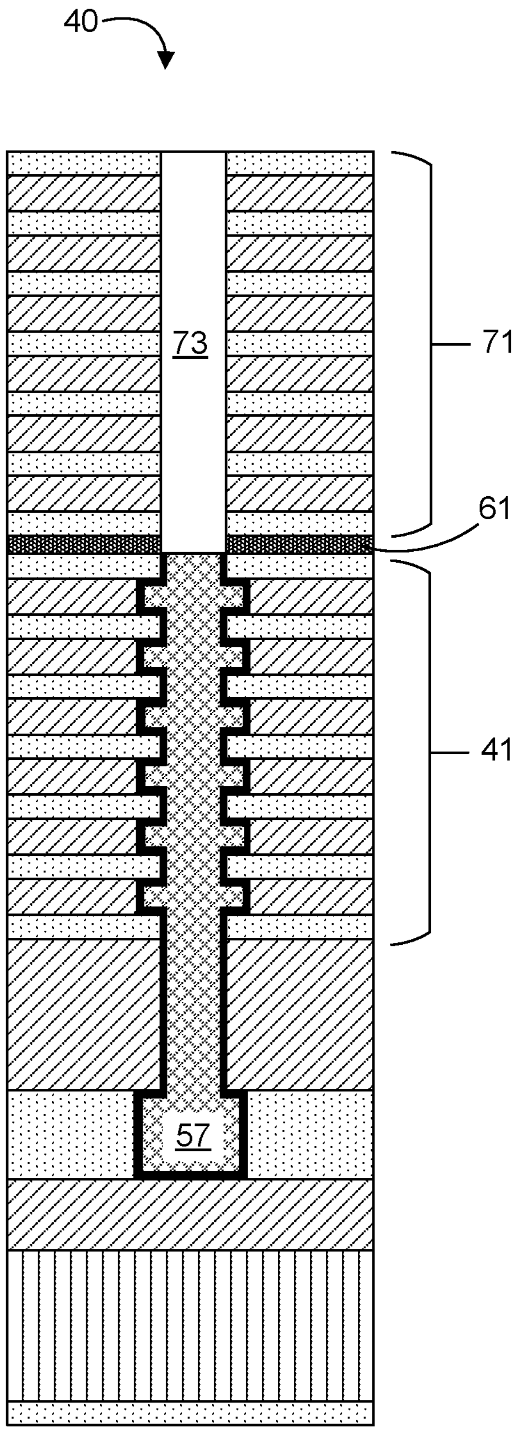
Figure 4L:
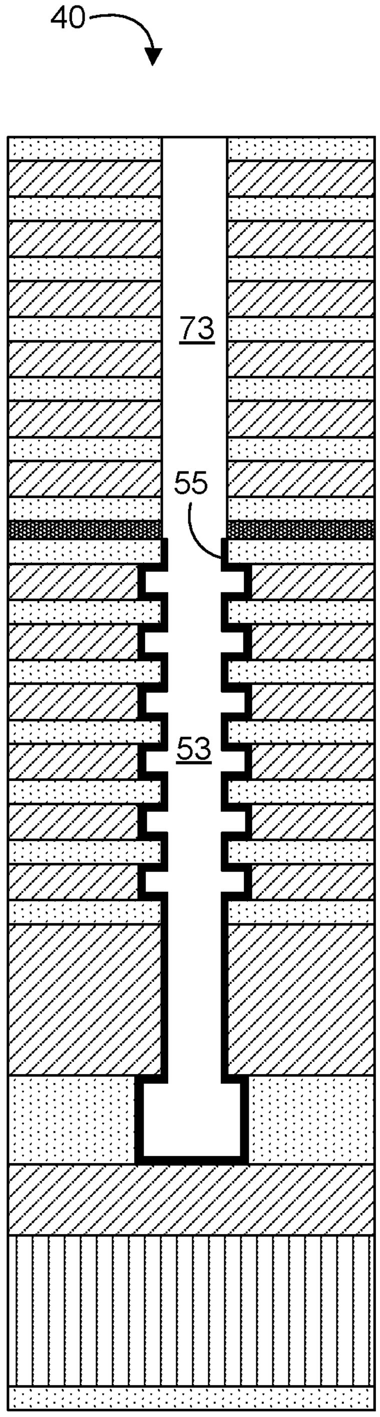
Figure 4M:
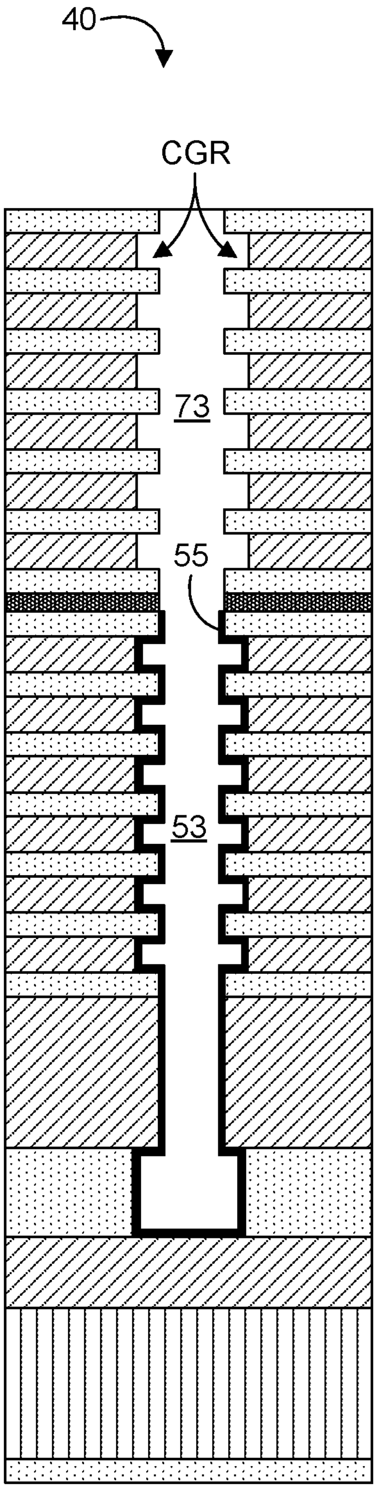
Figure 4N:
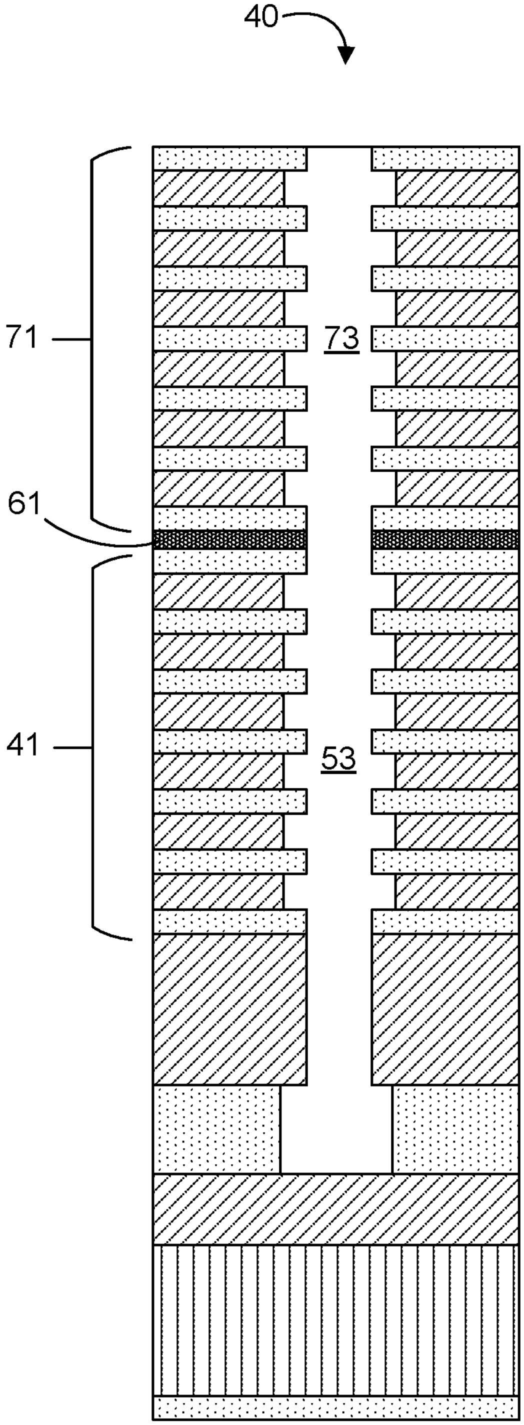

With reference to FIGS. 4A to 4N, an embodiment of an integration process 40 for super-pillar formation for a memory device may implement one or more aspects of the method 20, with a representative result of a structure (e.g., see FIG. 4N) to support further integration of a vertical memory string. At FIG. 4A, the process 40 may include forming a first layer stack 41 of a bottom sub-deck of a memory device, for example, by depositing alternating layers of oxide and polysilicon on a pre-processed substrate 43 (e.g., previously prepared by any suitable fabrication technique(s) to a suitable starting point for the 3D memory device integration). The first layer stack 41 may correspond to a bottom sub-deck of the memory device. The substrate 43 may include one or more layers including a wafer, poly layers, oxide layers, etc. on the wafer to implement a desired circuit structure under the memory array. One of the oxide layers 45 of the substrate 43 may include a plug 47 that provides an etch stop for a bottom sub-deck pillar. In some embodiments, forming the oxide-poly-oxide-poly (OPOP) first layer stack 41 may typically include low pressure chemical vapor deposition (LPCVD) deposited substitutionally doped polysilicon and oxide.

At FIG. 4B, the process 40 may include forming a mask layer 51 on top of the layer stack 41 to provide a precise location for a bottom sub-deck pillar 53, and etching the bottom sub-deck pillar 53 through the first layer stack 41, stopping at the plug 47. For example, anisotropic etching of a cylinder-shaped hole through the first layer stack 41 may be utilized to form the bottom sub-deck pillar 53 in the first layer stack 41.

At FIG. 4C, the process 40 may include a cleaning process to remove the mask layer 51 and the material of the plug 47, leaving a clean bottom sub-deck pillar 53.

At FIG. 4D, after pillar formation and cleaning, the process 40 may include wet etching to form a control gate recess (CGR) in each of the poly layers of the layer stack 41. The CGRs may be formed via an isotropic etch of wordline polysilicon layers (e.g., selective to oxide layers) to create recessed cavities for the subsequently integrated control gates of the memory cells.

At FIG. 4E, the process 40 may include forming a liner 55 on the walls of the pillar 53 and the CGRs. For example, polysilicon or silicon nitride or a pure oxide layer may be deposited to form the liner 55.

At FIG. 4F, the process 40 may include forming a plug 57 in the pillar 53. For example, a high K material (e.g., such as aluminum oxide (AlOx)) may be deposited to fill the pillar 53 and cover the layer stack 41, thus forming the plug 57. The plug 57 may not be fully filled within the pillar 53 but may be formed with some void inside the pillar 53, as long as the top side of the pillar 53 is filled with the plug 57. The material of the plug 57 may provide a sacrificial etch stop material for a subsequently integrated top sub-deck pillar.

At FIG. 4G, the process 40 may include a chemical polish that removes the plug material and liner material from around the top of the plug 57 and that planarizes a topmost oxide layer of the layer stack 41.

At FIG. 4H, the process 40 may include forming a transition layer 61 on top of the layer stack 41 and the plug 57. For example, transition material (e.g., oxide, nitride, etc.) may be deposited at a controlled thickness to form the transition layer 61.

At FIG. 4I, the process 40 may include chemical polish of the transition material to planarize the transition layer 61 to a selected thickness.

The process may repeat the preceding process to form a top sub-deck of the memory device, immediately adjacent to the bottom sub-deck. For example, the process 40 may include forming a second layer stack 71 of the top sub-deck of the memory device, for example, by depositing alternating layers of oxide and polysilicon on the transition layer 61 (see FIG. 4J), forming a mask layer on top of the second layer stack 71 to provide a precise location for the top sub-deck pillar 73 (e.g., utilizing a photo alignment process to align the pillar 73 with the pillar 53), and etching the top sub-deck pillar 73 through the second layer stack 71 stopping at the plug 57 (see FIG. 4K). For example, anisotropic etching of a cylinder-shaped hole through the layer stack 71 may be utilized to form the top sub-deck pillar 73 in the layer stack 71.

At FIG. 4L, the process 40 may include a cleaning process to remove the mask layer and the material of the plug 57, leaving a clean top sub-deck pillar 73 connected to a clean bottom sub-deck pillar 53 to form a super-pillar. For example, a wet process may be utilized to remove the plug material while leaving the liner 55 in place.

At FIG. 4M, the process 40 may include forming CGRs in the layer stack 71 of the top sub-deck. For example, a wet etching process may be utilized to form the CGRs in the top sub-deck. The liner 55 may protect the CGRs of the bottom sub-deck during the formation of the CGRs of the top sub-deck.

When connecting the two shorter pillars 53, 73 of the bottom and top sub-decks together to form the super-pillar, a transition region thickness may be fine-tuned, along with careful handling of the etch stop material (e.g., plug 57) for the top sub-deck pillar 73 (e.g., to provide process uniformity) and careful handling of the super-pillar wet clean process before the memory cell formation, to ensure that the resulting structure meets all design criteria, such as a necking critical dimension (CD) at the transition region. For example, the transition region material (e.g., oxide) thickness may impact the necking CD for the whole super-pillar, influence the cell formation, etc. In accordance with some embodiments, a transition region oxide thickness between the top sub-deck and bottom sub-deck is selected (e.g., at FIG. 4I) to maintain a desired necking CD.

At FIG. 4N, the process 40 may include removal of the liner 55, leaving a super-pillar that comprises the bottom sub-deck pillar 53 through the first layer stack 41 combined with the top sub-deck pillar 73 through the second layer stack 73, with the transition layer 61 disposed directly between the first layer stack 41 and the second layer stack 71. If the liner material is polysilicon, the liner 55 may be removed when the CGRs are formed in the top sub-deck.

The super-pillar wet process clean may be fine-tuned to provide a suitable multi-sub-deck connection. For example, the whole pillar clean process may include opening the top sub-deck pockets and bottom sub-deck liner film removal. Embodiments may provide bottom sub-deck pockets for CGRs that substantially match the top sub-deck pockets after bottom sub-deck liner removal and after the whole pillar clean process.

At this point in the process 40, the sub-deck pillars may be plugged, another transition layer may be prepared, and the preceding steps may be repeated to add additional sub-decks. After all the desired sub-decks have been integrated, the super-pillar is ready for vertical memory cell integration. Any suitable 3D memory technology may utilize embodiments of the super-pillar integration process described herein, including floating gate 3D NAND memory.

The entire string of vertical 3D memory cells share a common polysilicon channel in the super-pillar after completing the memory cells formation. In some implementations, a plurality of wordlines are respectively coupled to the plurality of control gates, and the read/write/erase functionality of the 3D memory cells happen via charge trapping/detrapping/sensing between the polysilicon channel and control gates respectively.

In some embodiments, in the transition region, a seam and/or interface material may be found between two sub-deck pillars that are combined to form a super pillar. A detailed examination of the profile of an embodiment of a super-pillar (e.g., with TEM/SEM images) may show the seam/material in the transition region. If the transition layer material is the same as the insulator material of the layer stack, the detailed examination may indicate a seam between two sub-decks. The detailed examination may also show structure at or between two sub-deck pillars that indicates a small degree of mis-alignment, no plug remnants, and/or interface material.

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

Figure 5:
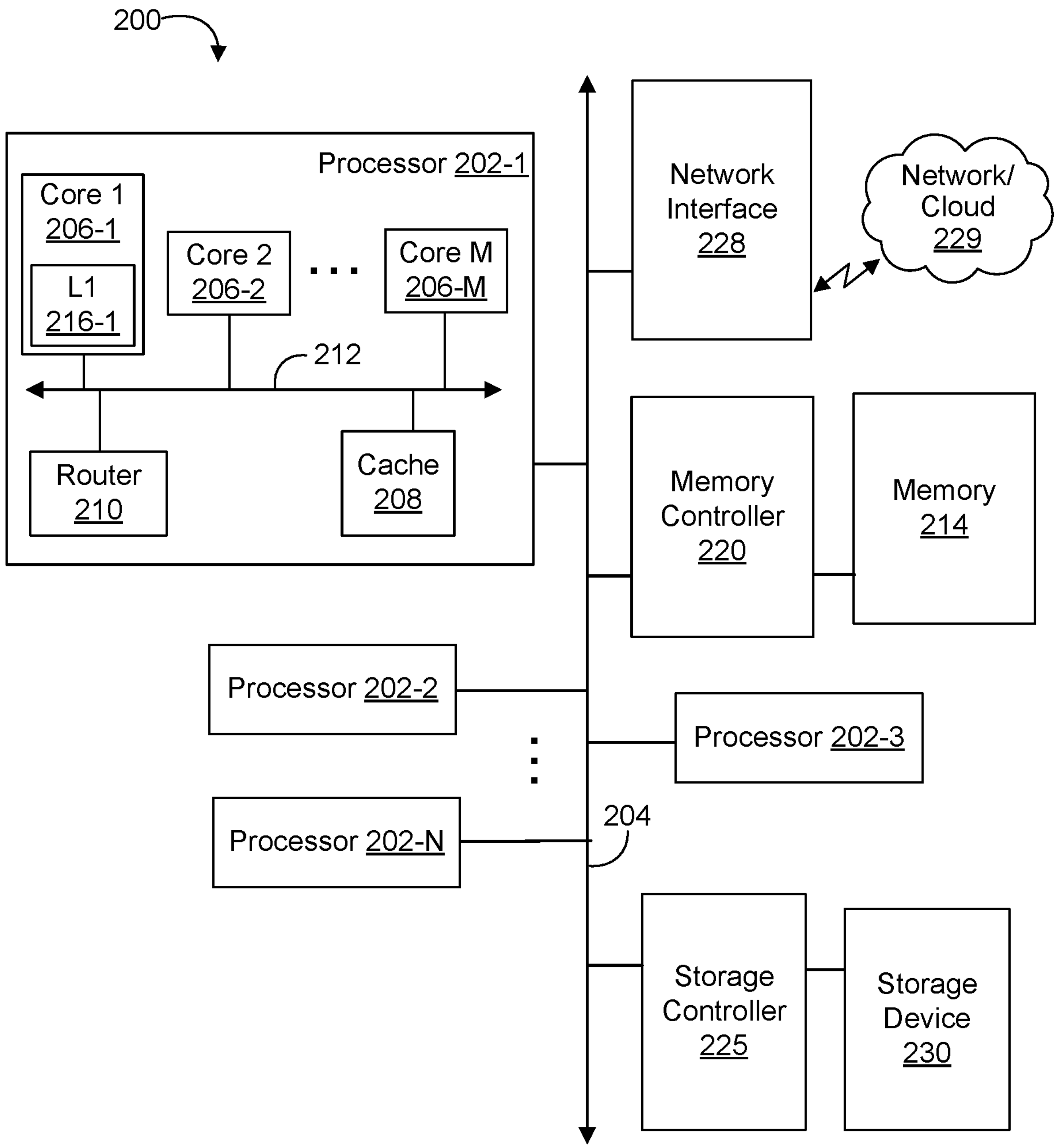
FIG. 5 is a block diagram of an example of a computing system according to an embodiment.

Turning now to FIG. 5, an embodiment of a computing system 200 may include one or more processors 202-1 through 202-N (generally referred to herein as "processors 202" or "processor 202"). The processors 202 may communicate via an interconnection or bus 204. Each processor 202 may include various components some of which are only discussed with reference to processor 202-1 for clarity. Accordingly, each of the remaining processors 202-2 through 202-N may include the same or similar components discussed with reference to the processor 202-1.

In some embodiments, the processor 202-1 may include one or more processor cores 206-1 through 206-M (referred to herein as "cores 206," or more generally as "core 206"), a cache 208 (which may be a shared cache or a private cache in various embodiments), and/or a router 210. The processor cores 206 may be implemented on a single integrated circuit (IC) chip. Moreover, the chip may include one or more shared and/or private caches (such as cache 208), buses or interconnections (such as a bus or interconnection 212), memory controllers, or other components.

In some embodiments, the router 210 may be used to communicate between various components of the processor 202-1 and/or system 200. Moreover, the processor 202-1 may include more than one router 210. Furthermore, the multitude of routers 210 may be in communication to enable data routing between various components inside or outside of the processor 202-1.

The cache 208 may store data (e.g., including instructions) that is utilized by one or more components of the processor 202-1, such as the cores 206. For example, the cache 208 may locally cache data stored in a memory 214 for faster access by the components of the processor 202. As shown in FIG. 5, the memory 214 may be in communication with the processors 202 via the interconnection 204. In some embodiments, the cache 208 (that may be shared) may have various levels, for example, the cache 208 may be a mid-level cache and/or a last-level cache (LLC). Also, each of the cores 206 may include a level 1 (L1) cache (216-1) (generally referred to herein as "L1 cache 216"). Various components of the processor 202-1 may communicate with the cache 208 directly, through a bus (e.g., the bus 212), and/or a memory controller or hub.

As shown in FIG. 5, memory 214 may be coupled to other components of system 200 through a memory controller 220. Memory 214 may include volatile memory and may be interchangeably referred to as main memory or system memory. Even though the memory controller 220 is shown to be coupled between the interconnection 204 and the memory 214, the memory controller 220 may be located elsewhere in system 200. For example, memory controller 220 or portions of it may be provided within one of the processors 202 in some embodiments. Alternatively, memory 214 may include byte-addressable non-volatile memory such as INTEL OPTANE technology.

The system 200 may communicate with other devices/systems/networks via a network interface 228 (e.g., which is in communication with a computer network and/or the cloud 229 via a wired or wireless interface). For example, the network interface 228 may include an antenna (not shown) to wirelessly (e.g., via an Institute of Electrical and Electronics Engineers (IEEE) 802.11 interface (including IEEE 802.11a/b/g/n/ac, etc.), cellular interface, 3G, 4G, LTE, BLUETOOTH, etc.) communicate with the network/cloud 229.

System 200 may also include a storage device such as a storage device 230 coupled to the interconnect 204 via storage controller 225. Hence, storage controller 225 may control access by various components of system 200 to the storage device 230. Furthermore, even though storage controller 225 is shown to be directly coupled to the interconnection 204 in FIG. 10, storage controller 225 can alternatively communicate via a storage bus/interconnect (such as the SATA (Serial Advanced Technology Attachment) bus, Peripheral Component Interconnect (PCI) (or PCI EXPRESS (PCIe) interface), NVM EXPRESS (NVMe), Serial Attached SCSI (SAS), Fiber Channel, etc.) with one or more other components of system 200 (for example where the storage bus is coupled to interconnect 204 via some other logic like a bus bridge, chipset, etc.) Additionally, storage controller 225 may be incorporated into memory controller logic or provided on a same integrated circuit (IC) device in various embodiments (e.g., on the same circuit board device as the storage device 230 or in the same enclosure as the storage device 230).

Furthermore, storage controller 225 and/or storage device 230 may be coupled to one or more sensors (not shown) to receive information (e.g., in the form of one or more bits or signals) to indicate the status of or values detected by the one or more sensors. These sensor(s) may be provided proximate to components of system 200 (or other computing systems discussed herein), including the cores 206, interconnections 204 or 212, components outside of the processor 202, storage device 230, SSD bus, SATA bus, storage controller 225, etc., to sense variations in various factors affecting power/thermal behavior of the system/platform, such as temperature, operating frequency, operating voltage, power consumption, and/or inter-core communication activity, etc.

Any of the memory and/or storage devices in the system 200 may include the 3D memory with super-pillars as described herein.

Additional Notes and Examples

Example 1 includes a memory device, comprising a super-pillar formed through a plurality of sub-decks, a string of memory cells formed along the super-pillar, and respective regions of transition material disposed between respective sub-decks of the plurality of sub-decks, wherein the super-pillar comprises at least a first pillar formed through a first sub-deck of the plurality of sub-decks substantially aligned with a second pillar formed through a second sub-deck of the plurality of sub-decks.

Example 2 includes the memory device of Example 1, wherein the first sub-deck comprises a first layer stack with alternated layers of conductor material and insulator material, the second sub-deck comprises a second layer stack with alternated layers of conductor material and insulator material, and wherein a first region of transition material is disposed directly between a first outermost layer of insulator material of the first layer stack and a second outermost layer of insulator material of the second layer stack.

Example 3 includes the memory device of Example 2, wherein the first region of transition material, the first layer of insulator material, and the second layer of insulator material all comprise a same material.

Example 4 includes the memory device of Example 2, wherein the first region of transition material comprises a different material from one or more of the first layer of insulator material and the second layer of insulator material.

Example 5 includes the memory device of any of Examples 1 to 4, further comprising an array of super-pillars formed through the plurality of sub-decks, and respective strings of memory cells formed along respective super-pillars of the array of super-pillars.

Example 6 includes the memory device of any of Examples 1 to 5, wherein the memory cells comprise floating gate NAND memory cells.

Example 7 includes a system, comprising a processor, and a three-dimensional (3D) memory device coupled with the processor, wherein the 3D memory device includes a super-pillar formed through a plurality of sub-decks, a 3D string of memory cells formed along the super-pillar, and respective regions of transition material disposed between respective sub-decks of the plurality of sub-decks, wherein the super-pillar comprises at least a first pillar formed through a first sub-deck of the plurality of sub-decks is substantially aligned with a second pillar formed through a second sub-deck of the plurality of sub-decks.

Example 8 includes the system of Example 7, wherein the first sub-deck comprises a first layer stack with alternated layers of conductor material and insulator material, the second sub-deck comprises a second layer stack with alternated layers of conductor material and insulator material, and wherein a first region of transition material is disposed directly between a first layer of insulator material of the first layer stack and a second layer of insulator material of the second layer stack.

Example 9 includes the system of Example 8, wherein the first region of transition material, the first layer of insulator material, and the second layer of insulator material all comprise a same material.

Example 10 includes the system of Example 8, wherein the first region of transition material comprises a different material from one or more of the first layer of insulator material and the second layer of insulator material.

Example 11 includes the system of any of Examples 7 to 10, wherein the 3D memory device further comprises an array of super-pillars formed through the plurality of sub-decks, and respective 3D strings of memory cells formed along respective super-pillars of the array of super-pillars.

Example 12 includes the system of any of Examples 7 to 11, wherein the memory cells comprise floating gate NAND memory cells.

Example 13 includes a method, comprising forming a first layer stack of alternating layers of conductor material and insulator material, forming a first pillar in the first layer stack, forming a transition layer on the first layer stack, forming a second layer stack of alternating layers of conductor material and insulator material on the transition layer, forming a second pillar in the second layer stack substantially aligned with the first pillar, combining the second pillar with the first pillar to form a super-pillar, and forming a string of memory cells along the super-pillar.

Example 14 includes the method of Example 13, further comprising, prior to forming the transition layer on the first layer stack forming a first plurality of control gate recesses adjacent to the first pillar in the conductor material of the first layer stack, and forming a protective liner on walls of the first pillar and the plurality of control gate recesses.

Example 15 includes the method of Example 14, further comprising, after forming the protective liner on walls of the first pillar and the first plurality of control gate recesses plugging the first pillar with a sacrificial etch stop material.

Example 16 includes the method of Example 15, wherein forming the second pillar in the second layer stack substantially aligned with the first pillar comprises aligning a location for the second pillar with the first pillar, and etching a cylinder-shaped hole through the second layer stack to form the second pillar.

Example 17 includes the method of Example 16, wherein combining the second pillar with the first pillar to form the super-pillar comprises removing the sacrificial etch stop material from the first pillar.

Example 18 includes the method of Example 17, further comprising forming a second plurality of control gate recesses adjacent to the second pillar in the conductor material of the second layer stack.

Example 19 includes the method of any of Examples 17 to 18, further comprising removing the protective liner from the walls of the first pillar and the plurality of control gate recesses.

Example 20 includes the method of any of Examples 13 to 19, wherein the string of memory cells comprises a three-dimensional string of NAND memory cells.

Example 21 includes an apparatus for manufacturing a memory device, comprising means for forming a first layer stack of alternating layers of conductor material and insulator material, means for forming a first pillar in the first layer stack, means for forming a transition layer on the first layer stack, means for forming a second layer stack of alternating layers of conductor material and insulator material on the transition layer, means for forming a second pillar in the second layer stack substantially aligned with the first pillar, means for combining the second pillar with the first pillar to form a super-pillar, and means for forming a string of memory cells along the super-pillar.

Example 22 includes the apparatus of Example 21, further comprising means for forming a first plurality of control gate recesses adjacent to the first pillar in the conductor material of the first layer stack, prior to forming the transition layer on the first layer stack, and means for forming a protective liner on walls of the first pillar and the plurality of control gate recesses.

Example 23 includes the apparatus of Example 22, further comprising means for plugging the first pillar with a sacrificial etch stop material, after forming the protective liner on walls of the first pillar and the first plurality of control gate recesses.

Example 24 includes the apparatus of Example 23, wherein the means for forming the second pillar in the second layer stack substantially aligned with the first pillar comprises means for aligning a location for the second pillar with the first pillar, and means for etching a cylinder-shaped hole through the second layer stack to form the second pillar.

Example 25 includes the apparatus of Example 24, wherein the means for combining the second pillar with the first pillar to form the super-pillar comprises means for removing the sacrificial etch stop material from the first pillar.

Example 26 includes the apparatus of Example 25, further comprising means for forming a second plurality of control gate recesses adjacent to the second pillar in the conductor material of the second layer stack.

Example 27 includes the apparatus of any of Examples 25 to 26, further comprising means for removing the protective liner from the walls of the first pillar and the plurality of control gate recesses.

Example 28 includes the apparatus of any of Examples 21 to 27, wherein the string of memory cells comprises a three-dimensional string of NAND memory cells.

The term “coupled” may be used herein to refer to any type of relationship, direct or indirect, between the components in question, and may apply to electrical, mechanical, fluid, optical, electromagnetic, electromechanical or other connections. In addition, the terms “first”, “second”, etc. may be used herein only to facilitate discussion, and carry no particular temporal or chronological significance unless otherwise indicated.

As used in this application and in the claims, a list of items joined by the term “one or more of” may mean any combination of the listed terms. For example, the phrase “one or more of A, B, and C” and the phrase “one or more of A, B, or C” both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as bit stream multiplexer or de-multiplexer modules and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

In addition, any one or more of the operations discussed herein may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more graphics processing unit(s) or processor core(s) may undertake one or more of the blocks of the example processes herein in response to program code and/or instructions or instruction sets conveyed to the processor by one or more machine-readable media. In general, a machine-readable medium may convey software in the form of program code and/or instructions or instruction sets that may cause any of the devices and/or systems described herein to implement at least portions of the operations discussed herein and/or any portions the devices, systems, or any module or component as discussed herein.

As used in any implementation described herein, the term “module” refers to any combination of software logic, firmware logic, hardware logic, and/or circuitry configured to provide the functionality described herein. The software may be embodied as a software package, code and/or instruction set or instructions, and “hardware”, as used in any implementation described herein, may include, for example, singly or in any combination, hardwired circuitry, programmable circuitry, state machine circuitry, fixed function circuitry, execution unit circuitry, and/or firmware that stores instructions executed by programmable circuitry. The modules may, collectively or individually, be embodied as circuitry that forms part of a larger system, for example, an integrated circuit (IC), system on-chip (SoC), and so forth.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as IP cores may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments are not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. A memory device, comprising:

a super-pillar formed through a plurality of sub-decks;

a string of memory cells formed along the super-pillar; and one or more respective regions of transition material disposed between respective sub-decks of the plurality of sub-decks, wherein the super-pillar comprises at least a first pillar formed through a first sub-deck of the plurality of sub-decks substantially aligned with a second pillar formed through a second sub-deck of the plurality of sub-decks;

wherein each of the plurality of sub-decks include a respective layer stack of alternated layers of conductor material and insulator material; and wherein the super-pillar has a width that alternates between a first width and a second width smaller than the first width, the first width corresponding to a plurality of layers of conductor material of the plurality of sub-decks, the second width corresponding to both the one or more respective regions of transition material and a plurality of layers of insulator material of the plurality of sub-decks, wherein each of the one or more respective regions of transition material includes a layer of dielectric material enclosing a pillar opening that has a dimension matching the second width of the plurality of layers of insulator material of the plurality of sub-decks.

2. The memory device of claim 1, wherein the first sub-deck comprises a first layer stack with alternated layers of conductor material and insulator material, the second sub-deck comprises a second layer stack with alternated layers of conductor material and insulator material, and wherein a first region of transition material is disposed directly between a first outermost layer of insulator material of the first layer stack and a second outermost layer of insulator material of the second layer stack.

3. The memory device of claim 2, wherein the first region of transition material, the first outermost layer of insulator material, and the second outermost layer of insulator material all comprise a same material.

4. The memory device of claim 2, wherein the first region of transition material comprises a different material from one or more of the first outermost layer of insulator material and the second outermost layer of insulator material.

5. The memory device of claim 1, further comprising:

an array of super-pillars formed through the plurality of sub-decks; and respective strings of memory cells formed along respective super-pillars of the array of super-pillars.

6. The memory device of claim 1, wherein the memory cells comprise floating gate NAND memory cells.

7. A system, comprising:

a processor; and a three-dimensional (3D) memory device coupled with the processor, wherein the 3D memory device includes:

a super-pillar formed through a plurality of sub-decks;

a 3D string of memory cells formed along the super-pillar; and one or more respective regions of transition material disposed between respective sub-decks of the plurality of sub-decks, wherein the super-pillar comprises at least a first pillar formed through a first sub-deck of the plurality of sub-decks is substantially aligned with a second pillar formed through a second sub-deck of the plurality of sub-decks;

wherein each of the plurality of sub-decks include a respective layer stack of alternated layers of conductor material and insulator material; and wherein the super-pillar has a width that alternates between a first width and a second width smaller than the first width, the first width corresponding to a plurality of layers of conductor material of the plurality of sub-decks, the second width corresponding to both the one or more respective regions of transition material and a plurality of layers of insulator material of the plurality of sub-decks, wherein each of the one or more respective regions of transition material includes a layer of dielectric material enclosing a pillar opening that has a dimension matching the second width of the plurality of layers of insulator material of the plurality of sub-decks.

8. The system of claim 7, wherein the first sub-deck comprises a first layer stack with alternated layers of conductor material and insulator material, the second sub-deck comprises a second layer stack with alternated layers of conductor material and insulator material, and wherein a first region of transition material is disposed directly between a first layer of insulator material of the first layer stack and a second layer of insulator material of the second layer stack.

9. The system of claim 8, wherein the first region of transition material, the first layer of insulator material, and the second layer of insulator material all comprise a same material.

10. The system of claim 8, wherein the first region of transition material comprises a different material from one or more of the first layer of insulator material and the second layer of insulator material.

11. The system of claim 7, wherein the 3D memory device further comprises:

an array of super-pillars formed through the plurality of sub-decks; and respective 3D strings of memory cells formed along respective super-pillars of the array of super-pillars.

12. The system of claim 7, wherein the memory cells comprise floating gate NAND memory cells.

13. A method, comprising:
- forming a first layer stack of alternating layers of conductor material and insulator material;
- forming a first pillar in the first layer stack;
- forming a transition layer on the first layer stack;
- forming a second layer stack of alternating layers of conductor material and insulator material on the transition layer;
- forming a second pillar in the second layer stack substantially aligned with the first pillar;
- combining the second pillar with the first pillar to form a super-pillar; and
- forming a string of memory cells along the super-pillar;
- wherein the super-pillar has a width that alternates between a first width and a second width smaller than the first width, the first width corresponding to a plurality of layers of conductor material of the first layer stack and the second layer stack, the second width corresponding to both the transition layer and a plurality of layers of insulator material of the first layer stack and the second layer stack.

14. The method of claim 13, further comprising, prior to forming the transition layer on the first layer stack:
- forming a first plurality of control gate recesses adjacent to the first pillar in the conductor material of the first layer stack; and
- forming a protective liner on walls of the first pillar and the first plurality of control gate recesses.

15. The method of claim 14, further comprising, after forming the protective liner on walls of the first pillar and the first plurality of control gate recesses:
- plugging the first pillar with a sacrificial etch stop material.

16. The method of claim 15, wherein forming the second pillar in the second layer stack substantially aligned with the first pillar comprises:
- aligning a location for the second pillar with the first pillar; and
- etching a cylinder-shaped hole through the second layer stack to form the second pillar.

17. The method of claim 16, wherein combining the second pillar with the first pillar to form the super-pillar comprises:
- removing the sacrificial etch stop material from the first pillar.

18. The method of claim 17, further comprising:
- forming a second plurality of control gate recesses adjacent to the second pillar in the conductor material of the second layer stack.

19. The method of claim 17, further comprising:
- removing the protective liner from the walls of the first pillar and the first plurality of control gate recesses.

20. The method of claim 13, wherein the string of memory cells comprises a 3D string of NAND memory cells.

* * * * *